United States Patent

Ball

[11] Patent Number: 5,817,530
[45] Date of Patent: Oct. 6, 1998

[54] USE OF CONDUCTIVE LINES ON THE BACK SIDE OF WAFERS AND DICE FOR SEMICONDUCTOR INTERCONNECTS

[75] Inventor: Michael B. Ball, Boise, Id.

[73] Assignee: Micron Technology, Inc., Boise, Id.

[21] Appl. No.: 721,474

[22] Filed: Sep. 27, 1996

Related U.S. Application Data

[62] Division of Ser. No. 650,741, May 20, 1996, abandoned.

[51] Int. Cl.[6] ................................................ H01L 21/60
[52] U.S. Cl. ........................................ 437/108; 437/109
[58] Field of Search .................................. 437/205, 206, 437/208, 209; 257/686, 777; 438/108, 109, 107

[56] References Cited

U.S. PATENT DOCUMENTS

| | | |
|---|---|---|
| 3,577,037 | 5/1971 | Di Pietro et al. . |
| 4,264,917 | 4/1981 | Ugon . |
| 4,754,316 | 6/1988 | Reid ........................................ 257/777 |
| 4,811,082 | 3/1989 | Jacobs et al. . |
| 4,862,245 | 8/1989 | Pashby et al. . |
| 5,012,323 | 4/1991 | Farnworth . |
| 5,135,878 | 8/1992 | Bartur ...................................... 437/208 |
| 5,146,308 | 9/1992 | Chance et al. . |
| 5,147,815 | 9/1992 | Casto . |
| 5,229,647 | 7/1993 | Gnadinger . |
| 5,239,198 | 8/1993 | Lin et al. . |
| 5,252,857 | 10/1993 | Kane et al. . |
| 5,266,833 | 11/1993 | Capps . |
| 5,291,061 | 3/1994 | Ball . |
| 5,311,059 | 5/1994 | Banerji et al. . |
| 5,323,060 | 6/1994 | Fogal et al. . |
| 5,331,235 | 7/1994 | Chun . |
| 5,380,681 | 1/1995 | Hsu .......................................... 437/208 |
| 5,394,303 | 2/1995 | Yamaji ...................................... 257/777 |
| 5,399,898 | 3/1995 | Rostoker . |
| 5,422,435 | 6/1995 | Takiar et al. . |
| 5,426,072 | 6/1995 | Finnila . |
| 5,438,224 | 8/1995 | Papageorge et al. . |
| 5,466,634 | 11/1995 | Beilstein, Jr. et al. .................. 437/209 |
| 5,471,369 | 11/1995 | Honda et al. . |
| 5,483,024 | 1/1996 | Russell et al. . |
| 5,484,959 | 1/1996 | Burns . |
| 5,532,512 | 7/1996 | Fillion et al. ........................... 257/686 |
| 5,535,101 | 7/1996 | Miles et al. . |
| 5,563,084 | 10/1996 | Ramm et al. ........................... 437/208 |
| 5,637,536 | 6/1997 | Val .......................................... 437/208 |

FOREIGN PATENT DOCUMENTS

| | | |
|---|---|---|
| 56-62351 | 5/1981 | Japan . |
| 62-126661 | 6/1987 | Japan . |
| 64-28856 | 1/1989 | Japan . |
| 3-169062 | 7/1991 | Japan . |

Primary Examiner—Kevin Picardat
Attorney, Agent, or Firm—Trask, Britt & Rossa

[57] ABSTRACT

An apparatus and a method for increasing integrated circuit density comprising semiconductor wafers, wafer portions or dice ("semiconductor elements") having conductive traces on the back side thereof. These semiconductor elements are stacked such that the traces on the back side of an upper semiconductor become part of the interconnect traces of the semiconductor stacked below. The traces lead to one or more edges of the semiconductor element such that the traces can make electrical contact with an external substrate, leadframe, or wiring arrangement.

13 Claims, 5 Drawing Sheets

USE OF CONDUCTIVE LINES ON THE BACK SIDE OF WAFERS AND DICE FOR SEMICONDUCTOR INTERCONNECTS

This is a division of application, Ser. No. 08/650,741, filed May 20, 1996, now abandoned.

BACKGROUND OF THE INVENTION

1. Field of the Invention

The present invention relates to an apparatus and a method for increasing semiconductor device density. In particular, the present invention relates to semiconductor wafers, wafer segments or dice having conductive traces on the back sides thereof. These semiconductor elements are stacked such that the electronic traces on the back side of an upper element become the external interconnect traces for an element stacked immediately below.

2. State of the Art

Higher performance, lower cost, increased miniaturization of components, and greater packaging density of integrated circuits are ongoing goals of the computer industry. Greater integrated circuit density is primarily limited by the space or "real estate" available for mounting dice on a carrier substrate such as a printed circuit board.

One method of increasing integrated circuit density is to stack dice vertically. U.S. Pat. No. 5,012,323 issued Apr. 30, 1991 to Farnworth ("Farnworth") teaches combining a pair of dice mounted on opposing sides of a lead frame. An upper die is back-bonded to the upper surface of the leads of the lead frame via a first adhesively coated, insulated film layer. A lower die is face-bonded to the lower lead frame die-bonding region via a second, adhesively coated, insulative film layer. The wire-bonding pads on both upper die and lower die are interconnected with the ends of their associated lead extensions with gold or aluminum bond wires. The lower die must be slightly larger than the upper die in order that the lower die bonding pads are accessible from above through a bonding window in the lead frame such that gold wire connections can be made to the lead extensions. However, this arrangement has a major disadvantage from a production standpoint, since the different size dice require that different equipment produce the different dice or that the same equipment be switched over in different production runs to produce the different dice. Moreover, the lead frame design employed by Farnworth employs long conductor runs between the die and the exterior of the package, and the lead frame configuration is specialized and rather complex.

U.S. Pat. No. 5,229,647 issued Jul. 20, 1993 to Gnadinger teaches a solid-state memory unit constructed using stacked wafers containing a large number of memory units in each wafer. Vertical connections between wafers are created using bumps at contact points and metal in through-holes aligned with the bumps. The bumps on one wafer make contact with metal pads on a mating wafer.

U.S. Pat. No. 5,291,061 issued Mar. 1, 1994 to Ball teaches a multiple stacked die device that contains up to four dice which does not exceed the height of current single die packages. The low profile of the device is achieved by close-tolerance stacking which is made possible by a low-loop-profile wirebonding operation and thin-adhesive layers between the stack dice.

U.S. Pat. No. 5,323,060 issued Jun. 21, 1994 to Fogal et al. teaches a multichip module that contains stacked die devices, the terminals or bond pads of which are wirebonded to a substrate or to adjacent die devices.

U.S. Pat. No. 5,399,898 issued May 21, 1995 to Rostoker ("Rostoker") teaches multichip, multitier semiconductor arrangements based on single and double-sided flip-chips. FIGS. 3a and 3b of Rostoker illustrate the use of dice with electrical contact points on both the back and face surfaces of a die. Using these dice to form a stacked die package eliminates the need for wirebonding and thus reduces the size of the stacked die package. These dice are double-sided flip-chips wherein the internal circuitry provides the appropriate circuit traces. However, these double-sided flip-chips are expensive and difficult to manufacture.

U.S. Pat. No. 5,422,435 to Takiar et al. teaches stacked dice having wire bonds extending to each other and to the leads of a carrier member such as a lead frame.

See also U.S. Pat. No. 5,146,308; 5,252,857; 5,266,833; and 5,484,959 for disclosures of various configurations of multi-die assemblies and edge connect configurations.

It would be advantageous to develop a stacking technique and assembly for increasing integrated circuit density using non-customized die configurations in combination with commercially-available, widely-practiced semiconductor device fabrication techniques.

SUMMARY OF THE INVENTION

The present invention relates to an apparatus and a method for increasing integrated circuit density. The back side of semiconductor wafers or dice are generally unused or "dead" space, containing no circuitry or electrical connections. With the miniaturization of semiconductors placing die and carrier substrate space or "real estate" at a premium, the present invention utilizes the dead space of the back sides of semiconductor wafers, wafer segments or dice to carry conductive traces. Thus, the apparatus of the present invention comprises semiconductor wafers, wafer segments or dice having conductive traces on the back side thereof. These semiconductor elements are stacked such that the traces on the back side of an upper element become part of the interconnect traces of an element stacked below (or laterally adjacent, if the stack is on its side). The final package could be a stack of wafers, a stack of wafer portions, or a stack of dice, the stack there affixed to a printed circuit board or other carrier substrate. The term "semiconductor element" will be used for purposes of this application to mean either a wafer, a wafer segment or a die.

The apparatus of the present invention is fabricated by providing a first semiconductor element and a second semiconductor element. The first semiconductor element has a face or active surface with a desired integrated circuitry pattern fabricated thereon. The second semiconductor element includes a metal or conductive material layer applied to its back side. Preferably, a layer of dielectric or insulative material is disposed between the second semiconductor element back side and the metal layer to prevent any electrical interference or shorting between the metal layer and the second semiconductor element. The metal layer is etched, using known industry techniques, to form at least one conductive trace having at least one contact area or pad. The metal layer must be sufficiently thick to prevent shorting and to carry adequate power and signals without interference or breakdown between the semiconductor element to be disposed adjacent the traces and external circuitry.

It is, of course, understood that rather than applying and etching a metal layer on the second die back side, the conductive traces and contact areas or pads could be formed by screen printing a conductive epoxy, ink, or the like on the back side of the second semiconductor element, by photolithography, by preforming the traces and adhering them to the back side of the semiconductor element, or by other means well known in the art.

The first semiconductor element face surface preferably carries one or more flip chip electric connections (such as a C4 solder bump connection or conductive polymer bump, these and other alternatives being known in the art, by way of example) extending from bond pads or other terminals on the first semiconductor element face surface. The flip chip electric connections extend between the first and the second semiconductor elements in such a manner that the flip chip electric connections of the first element physically (mechanically) attach to, and make electrical contact with, respective contact areas or pads of conductive traces on the second semiconductor element. The term "flip chip" connection as used herein is intended to include direct chip-to-substrate conductor connections rather than those made through a discrete intermediate conductive element through a bond wire, TAB (flex circuit) trace or other discrete conductor.

A face side of the second semiconductor element may also have at least one (and usually more) flip chip electric connection, as discussed for the first semiconductor element, extending from a bond pad or other terminal on the second semiconductor element face surface.

A dielectric sealing or underfill compound as known in the art may be placed between the first semiconductor element and the metal traces to prevent degradation and shorting of the connections and to more firmly secure the first semiconductor element to the second semiconductor element.

The conductive traces are preferably routed to form contacts proximate at least one edge of the second semiconductor element. The outer ends or terminations of the traces form contact sites. These contact sites are preferably used to make electrical contact with an external substrate, leadframe, or other external conductor or wiring arrangement.

Naturally, more than two dice can be stacked. In fact, a virtually unlimited number of semiconductor elements can be stacked so long as each semiconductor element but the lowermost one has a plurality of contact areas or pads of conductive traces on its back surface, which areas or pads mate with the conductive bumps of the semiconductor element below it. As noted, the lowermost semiconductor element need not have contact pads or traces on its back surface, since no other element will contact the back surface. It, of course, follows that the uppermost semiconductor element need not be fabricated with circuitry or can be a "known bad" semiconductor element since this element is only needed for the contact pads and the traces on its back surface. Using a known bad semiconductor element as the uppermost semiconductor element helps reduce the overall waste of the fabrication process by putting a defective part to use.

After a semiconductor element stack has been assembled, the stack can be mounted to a substrate, printed circuit board, or the like. Preferably, all of the terminations of the electronic traces on each of the semiconductors are aligned on a common side of the stack and on a common plane transverse to that of the stack such that all of the trace terminations can be connected to aligned terminals or contacts on the same substrate.

It is, of course, understood that multiple substrates could be attached to the stack on more than one side thereof. Additionally, it is understood that any number of attachment techniques known in the art could be used to attach the semiconductor stack to the substrate(s).

Thus, the arrangement of the invention increases semiconductor device density using non-customized die and bond pad patterns and commercially-practiced conductor attachment techniques.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
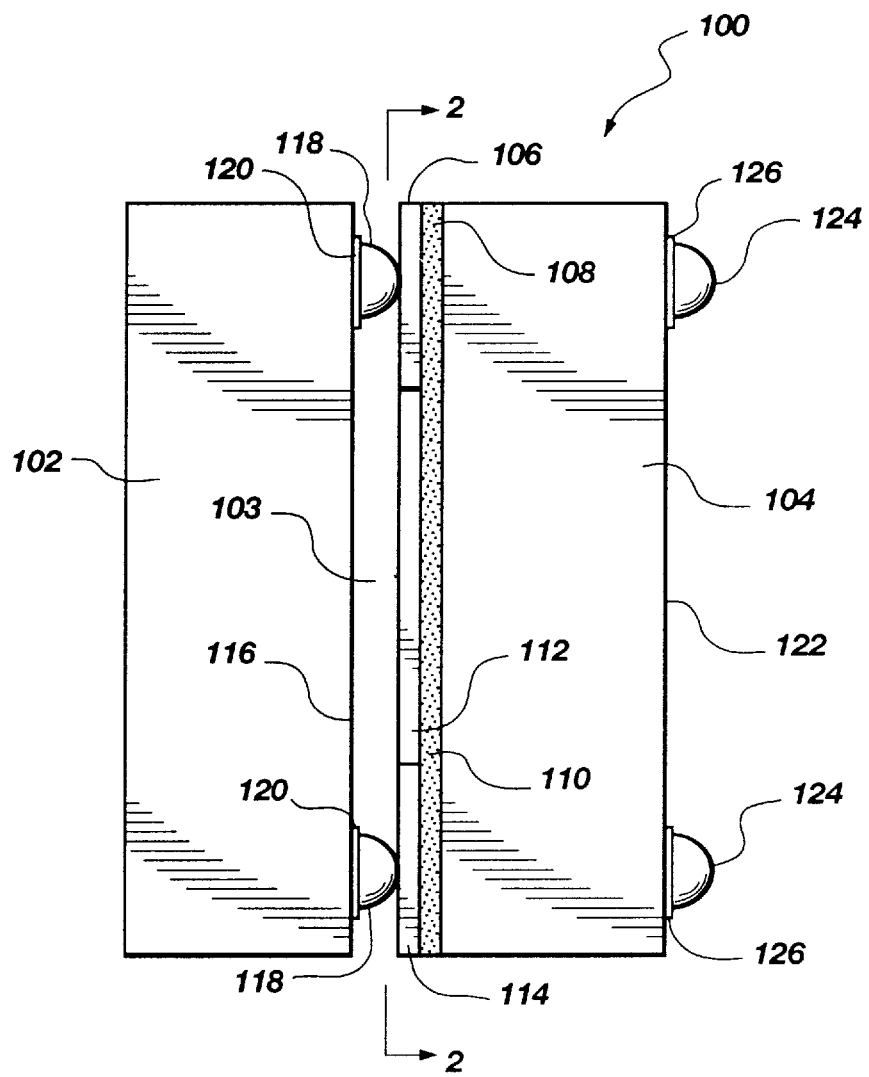
FIG. 1 is a side plan view of a die stack of the present invention.

FIG. 1 illustrates a stacked die assembly 100 of the present invention. The assembly 100 comprises a first die 102 attached to a second die 104. The second die 104 includes a metal or conductive material layer 106 applied to a back side 108 of second die 104. Preferably, a layer of dielectric or insulative material 110 is disposed between the second die back side 108 and the metal layer 106 to prevent any electrical interference or shorting with second die 104. The metal layer 106 is etched to form at least one electronic trace 112 and at least one contact pad 114. The metal layer 106 must be sufficiently thick such that it would make the stacking of dice possible without shorting and provide the ability to carry power and signals.

It is, of course, understood that rather than applying and etching a metal layer 106 on the second die back side 108, the electronic traces 112 and the contact pads 114 could be formed by the use of a conductive epoxy dispensed on the back side 108 of the second die 104, or in other manners as previously discussed.

The first die 102 has a face surface 116 including integrated circuitry, and with at least one flip chip electric connection 118 extending from a bond pad or other terminal 120 on the first die face surface 116. The flip chip electric connections 118 extend to the second die 104 in such a manner that the flip chip electric connections 118 physically (mechanically) attach to, and make electrical contact with, a respective contact pad 114 of a trace 112.

A face side 122 of the second die 104 carrying integrated circuitry may also have at least one flip chip electric connection 124, as discussed for the first die 102, extending from a bond pad or other terminal 126 on the second die face surface 122.

A sealing (underfill) compound (not shown) as known in the art may be disposed in area 103 between the first die 102 and the metal layer 106 to prevent degradation and shorting of the bump-to-pad connections and to more firmly secure the first die 102 to the second die 104.

It is, of course, understood that the dice do not necessarily have to be the same size die, or same or similar function die. Furthermore, it is understood that additional laminated layers of non-conductive and conductive material on the back side of one or more dice may be desirable to reroute certain power or signal paths.

Figure 2:
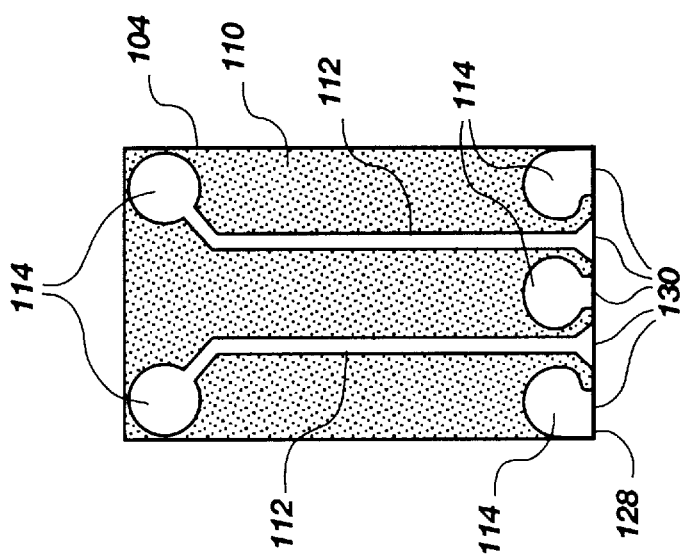
FIG. 2 is a plan view along line 2—2 of FIG. 1.

FIG. 2 illustrates a plan view along line 2—2 of FIG. 1 showing an example of conductive traces 112 and contact pads 114 on second die 104. The contact pads 114 are etched in predetermined locations to specifically match the flip chip electric connections 118 of first die 102 (i.e., mirror image thereof). The traces 112 are etched to form an electrical contact proximate at least one edge 128 of the second die 104. The terminations of the electronic traces 112 form external contact sites 130. These contact sites 130 are used to make electrical contact with an external printed circuit board ("PCB") or other carrier substrate (not shown). The PCB or other substrate in turn carries conductors which receive power and send signals to and from the edge of the PCB such as in a SIMM or PIMM module.

Figure 3:
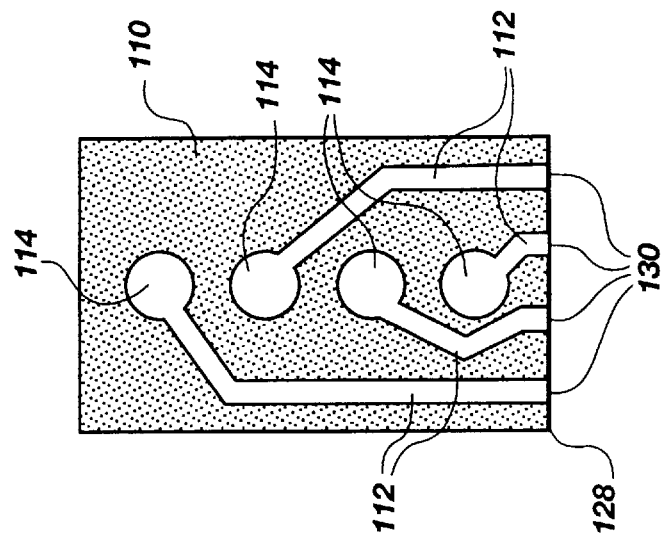
FIG. 3 is a plan view of an alternate circuit trace configuration.

FIG. 3 illustrates a plan view of an alternate example of electronic traces 112 and contact pads 114. This configuration is designed to accommodate a central line or row of electrical connectors on a first die and to form electrical contacts 130 with at least one edge 128 of the second die 104. Thus, it can be seen that any number of contact pads 114 and electronic traces 112 can be arranged in a multitude of configurations to effect a desired edge connect for the assembly.

The concept of stacking dice with the back side of each die facilitating external connection trace circuitry according to the present invention can be utilized in a number of configurations and assemblies. The preferred arrangements are wafer stacking, partial wafer stacking, and single die stacking.

Figure 5:
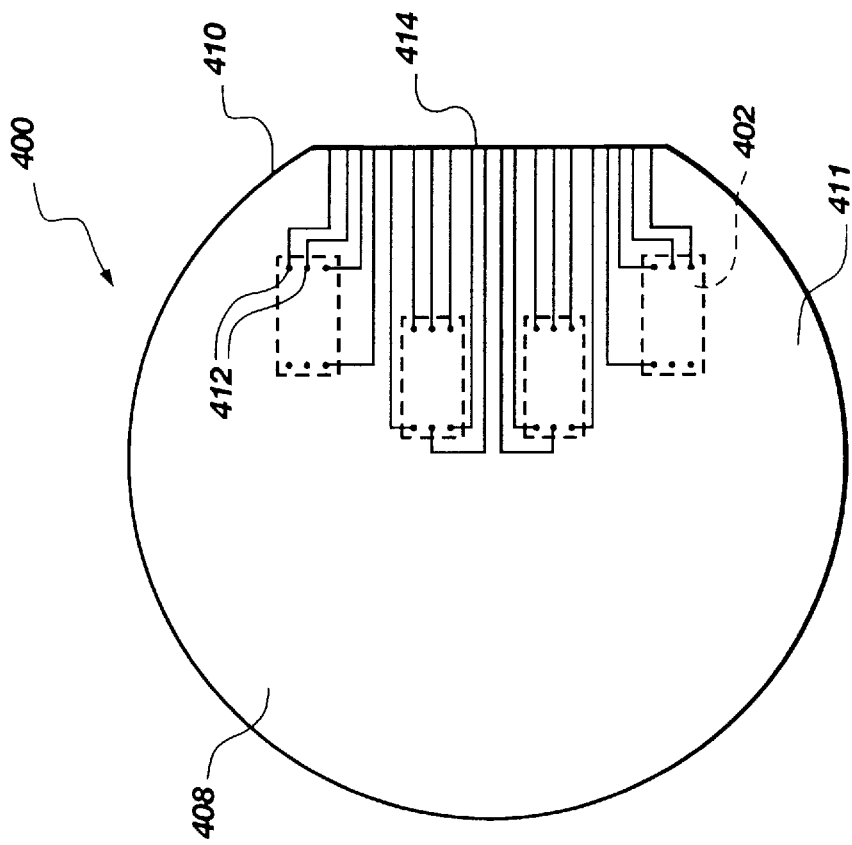
FIG. 5 is a bottom plan view of the wafer of FIG. 4 showing circuit traces.
Figure 4:
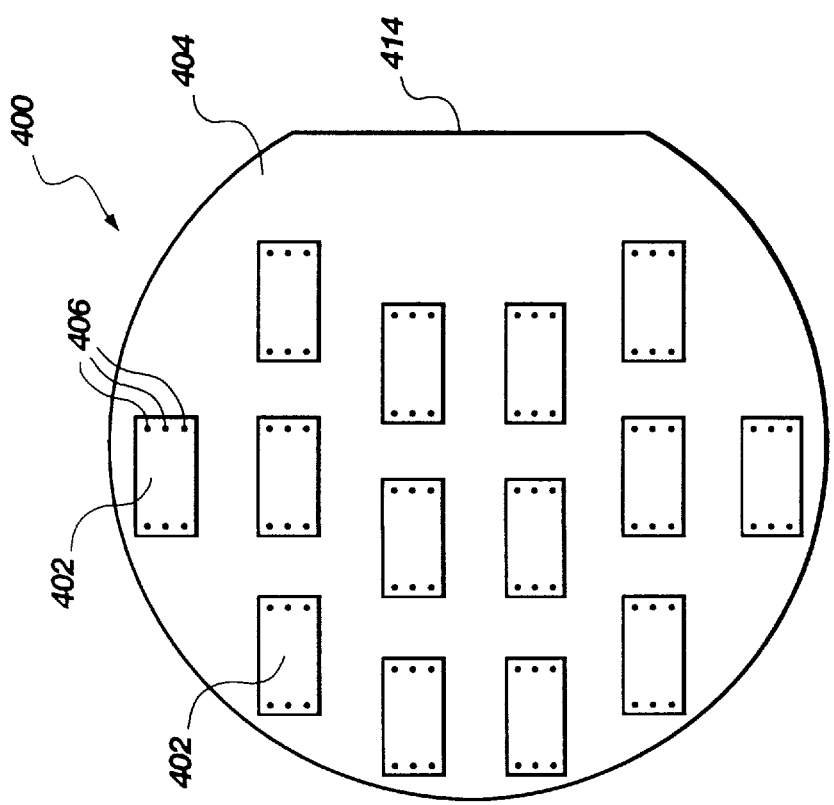
FIG. 4 is a top plan view of an etched wafer.

FIGS. 4 and 5 illustrate a top plan view and a bottom plan view, respectively, of a fabricated wafer 400 including integrated circuitry. The wafer 400 may be produced by fabricating appropriate circuitry in die areas 402, thereby forming a number of discrete semiconductor devices or dice on the face or active surface 404 of the wafer 400 by any known standard industry techniques. A plurality of conductive bumps (flip chip connections) 406, which make appropriate electrical contact with the circuitry on die areas 402 of the wafer 400, is then fabricated on the wafer face surface 404, also by techniques well known in the art.

A back side 408 of the wafer 400, shown in FIG. 5, includes a metal or conductive material layer which has been previously etched to form at least one conductive trace 410 and at least one contact pad 412. Die areas 402 on the face side of wafer 400 are shown in broken lines. Preferably, a layer of dielectric or insulative material 411 is disposed between the wafer back side 408 and the traces 410 and the contact pads 412 (as also shown in FIGS. 1–3). The traces 410 are routed to form an electrical contact with at least one edge 414 of the wafer 400, in this instance at the wafer flat. The terminations of the electronic traces 410 form contact sites (not shown), which may extend laterally beyond the traces if the trace pitch is large enough to accommodate. These contact sites are used to make electrical contact with an external substrate (not shown).

To construct a stacked wafer configuration, a second wafer 400 (not shown), which is specifically designed such that a plurality of conductive bumps 406 on the face surface of the second wafer mates with the contact pads 412 of the wafer 400, is attached by its face surface to the back side 408 of the wafer 400. A third wafer 400 (not shown), which is specifically designed such that a plurality of contact pads 412 on the back surface of the third wafer 400 mates with the conductive bumps 406 of the wafer 400, is attached by its back surface to the face surface 404 of the wafer 400. The stacking is repeated until the desired number of wafers in the stack is attained.

It is, of course, understood that the lowest wafer in the wafer stack need not have contact pads or electronic traces on its back surface. It is, of course, also understood that the uppermost wafer need not be etched with circuitry or can be a "known bad wafer" since this wafer is only needed for the contact pads and the electronic traces on its back surface.

Figure 6:
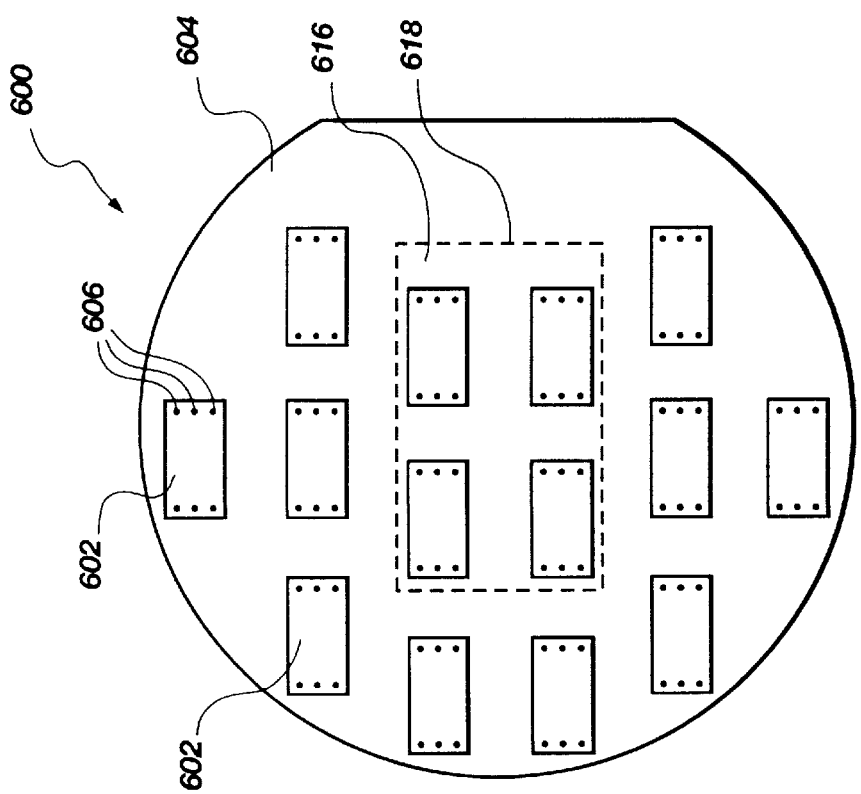
FIG. 6 is a top plan view of a wafer.

FIG. 6 illustrates a top plan view of a wafer 600. The wafer 600 is produced by fabricating appropriate circuitry in die areas 602 on a face surface 604 of the wafer 600 by any known standard industry techniques. A plurality of conductive bumps (flip chip connections) 606, which make appropriate electrical contact with the etched circuitry on die areas 602 of the wafer 600, is then formed on the wafer face surface 604.

A back side (not shown) of the wafer 600 includes a metal or conductive material layer which is etched to form at least one conductive trace and at least one contact pad, as generally discussed for FIGS. 4 and 5. A portion 616 (shown by dashed line 618) of the die areas 602 is cut from the wafer 600 by any known industry techniques, such as kerfing of the wafer while supported on a film carried by a frame.

Figure 7:
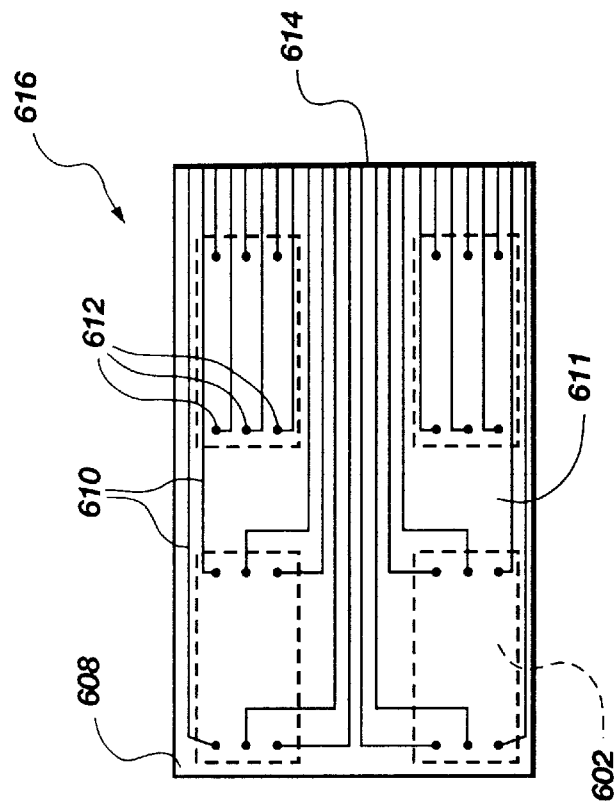
FIG. 7 is a bottom plan view of a portion of the wafer of FIG. 6 showing circuit traces.

FIG. 7 illustrates the back side 608 of excised die area portion 616 with die areas 602 on the face side shown in broken lines. The back side of die area portion 616 includes at least one trace 610 and at least one contact pad 612. Preferably, a layer of dielectric or insulative material 611 is disposed between the wafer back side 608 and the electronic traces 610 and the contact pads 612. The traces 610 are routed to form a row of electrical contacts along at least one edge 614 of the die area portion 616. These contact sites are used to make electrical contact with an external carrier substrate (not shown).

To construct a stacked configuration, a second excised die area portion 616, which is specifically designed such that a plurality of conductive bumps 606 on the face surface of the second die area portion 616 mate with the contact pads 612 of the die area portion 616, may be attached by its face surface to the back side 608 of the first die area portion 616. A third excised die area portion 616, which is specifically designed such that a plurality of contact pads 612 on the back surface of the third die area portion 616 mates with the conductive bumps 606 of the first die area portion 616, may be attached by its back surface to the face surface of the first die area portion 616.

It is, of course, understood that if each of the stacked die area portions are all the same size, location and shape on the respective wafers, the wafers 600 could first be stacked and affixed, then all stacked die portions could be cut from the stacked wafers in one step, in the manner disclosed and claimed in U.S. patent application Ser. No. (08/650,429), filed on even date herewith and assigned to the assignee of the present invention.

Figure 8:
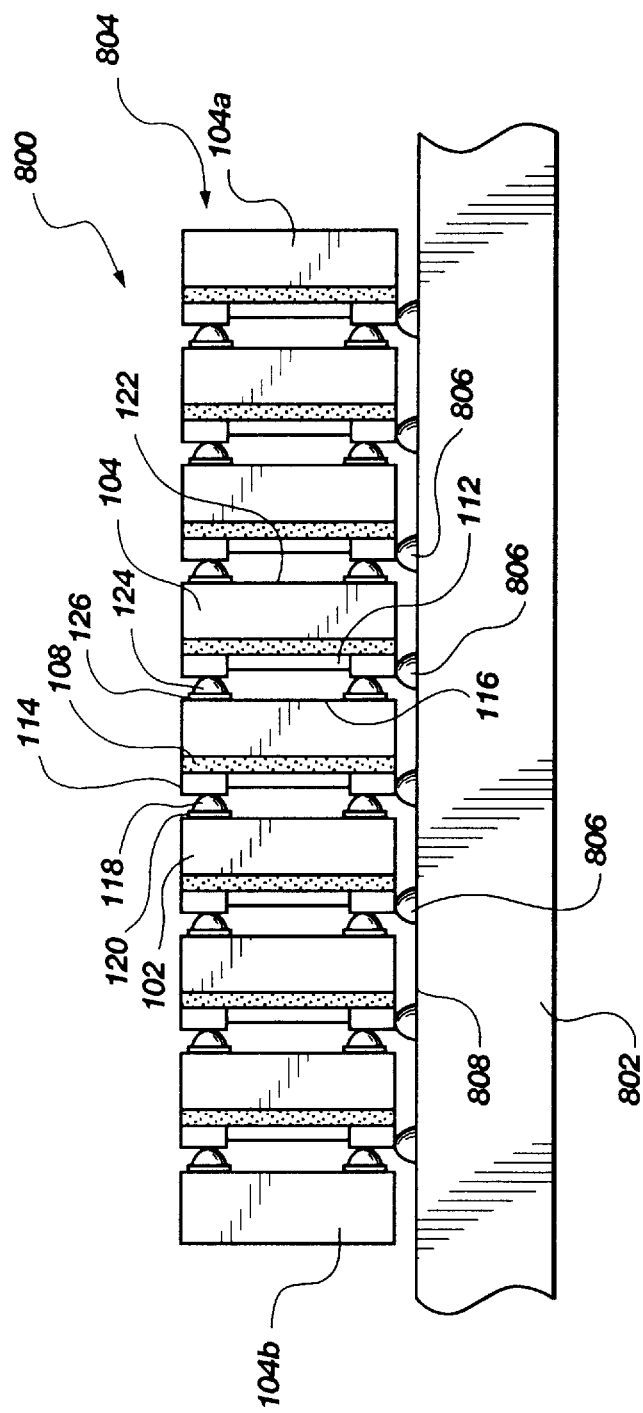
FIG. 8 is a side plan view of a die stack of the present invention attached to a substrate.

FIG. 8 illustrates a stacked die assembly 800 attached to a substrate, such as a printed circuit board, ceramic substrate or the like 802. The dice stack 804 comprises multiple dice (e.g. 102 and 104) attached together as shown in FIG. 1.

Components common to FIGS. 1–3 and 8 retain the same numeric designation. The dice (for example 102 and 104) are aligned using mechanical or optical apparatus as known in the art and attached using heat or other energy to reflow or cure the flip chip electric connection (e.g. 118) to the contact pads 114 on the back side of the adjacent die (e.g. 104). Once the dice stack 804 is formed, the stack 804 can then be mounted as a unit to the substrate 802. The substrate 802 preferably has a plurality of electric connections 806 made of solder, gold, or other suitable metal or alloy disposed on a carrier surface 808 of the substrate 802. The substrate electrical connections 806 are attached to and make electrical contact with the terminations 130 of the electronic traces 112 on each die using furnace heat, laser heat, ultrasound, or other energy source to weld the substrate electrical connection 806 to the terminations of the electronic traces 112. The substrate connections may also comprise conductive polymers or mechanical clip-type connections or slots for receiving the die edges including contact sides, all as known in the art. As previously discussed, it is noteworthy that right-hand end die 104a carries no connections 118 and may, in fact, comprise a defective die. Similarly, and as also previously mentioned, left-hand end die 104b carries no back side traces 112 or contact pads 114.

It is, of course, understood that multiple substrates could be attached to the stack, as along the top thereof (as shown in FIG. 8) or along one or both sides, wherever suitable edge contacts are present on the die stack. Additionally, it is understood that any number of attachment techniques known in the art could be used to attach the semiconductor stack with the substrate(s).

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A method of producing a semiconductor element configuration, comprising the steps of:

providing a discrete semiconductor element having a first active exterior surface and a second opposing exterior surface, wherein said first surface includes integrated circuitry thereon;

forming at least one flip chip connection on said first active exterior surface in communication with said integrated circuitry; and forming at least one conductive trace having a contact area on said second opposing exterior surface.

2. The method of claim 1, further comprising the step of interposing an insulative material between said second opposing exterior surface and said at least one conductive trace.

3. The method of claim 1, wherein the step of forming said at least one conductive trace includes:

applying a layer of conductive material on said second opposing exterior surface; and removing a portion of said conductive material to define said at least one conductive trace.

4. The method of claim 1, wherein the step of forming said at least one conductive trace comprises applying a conductive material defining said at least one conductive trace to said second opposing exterior surface.

5. A method of forming a semiconductor element stack configuration, comprising:

providing a plurality of discrete semiconductor elements, each having a first exterior surface and a second opposing exterior surface, wherein at least one of said first exterior surfaces includes integrated circuitry thereon;

forming at least one flip chip connection on said at least one first exterior surface including integrated circuitry in electrical communication therewith;

forming at least one conductive trace having a contact area on at least one of said second opposing exterior surfaces of a different semiconductor element than that which includes said integrated circuitry;

aligning said plurality of semiconductor elements facing in the same direction, one abutting another such that said second opposing exterior surface of a first discrete semiconductor element carrying said at least one conductive trace abuts said first exterior surface of a second semiconductor element having said integrated circuitry, wherein the at least one flip chip connection of the second semiconductor element contacts the contact area of the adjacent first discrete semiconductor element.

6. The method of claim 5, further comprising interposing an insulative material between said second opposing exterior surface of said at least one semiconductor element carrying said at least one conductive trace and said conductive trace.

7. The method of claim 5, further comprising routing said at least one conductive trace to an edge of its respective semiconductor element.

8. The method of claim 5, wherein the step of forming said at least one conductive trace includes:

applying a layer of conductive material on said second opposing exterior surface; and removing a portion of said conductive material to define said at least one conductive trace.

9. The method of claim 5, wherein the step of forming said at least one conductive trace comprises applying a conductive material defining said at least one conductive trace to said second opposing exterior surface.

10. A method of forming a semiconductor element assembly, comprising:

providing a plurality of semiconductor elements, each having a first exterior surface and a second opposing exterior surface;

at least one of said first exterior surfaces includes integrated circuitry thereon;

forming at least one flip chip connection on said at least one first exterior surface including integrated circuitry in electrical communication therewith;

forming at least one conductive trace having a contact area on at least one of said second opposing exterior surfaces of a different semiconductor element than that which includes said integrated circuitry and routing said conductive trace to an edge of that semiconductor element to terminate at an external connection point;

aligning said plurality of semiconductor elements facing in the same direction, one abutting another such that said second opposing exterior surface of a first discrete semiconductor element carrying said at least one conductive trace abuts said first exterior surface of a second semiconductor element having said integrated circuitry, wherein the at least one flip chip connection of the second semiconductor element contacts the contact area of the adjacent first discrete semiconductor element;

providing at least one substrate including at least one contact; and contacting said at least one substrate contact to said external connection point.

11. The method of claim 10, further comprising interposing an insulative material between said second opposing exterior surface and said at least one conductive trace.

12. The method of claim 10, wherein the step of forming said at least one conductive trace includes:

applying a layer of conductive material on said second opposing exterior surface; and removing a portion of said conductive material to define said at least one conductive trace.

13. The method of claim 10, wherein the step of forming said at least one conductive trace comprises applying a conductive material defining said at least one conductive trace to said second opposing exterior surface.

* * * * *